United States Patent [19]
Bae

[11] Patent Number: 5,326,712
[45] Date of Patent: Jul. 5, 1994

[54] METHOD FOR MANUFACTURING A THIN FILM TRANSISTOR

[75] Inventor: Byung-seong Bae, Kyungki-do, Rep. of Korea

[73] Assignee: Samsung Electronics Co., Ltd., Kyungki-do

[21] Appl. No.: 984,112

[22] Filed: Dec. 3, 1992

[30] Foreign Application Priority Data

Dec. 3, 1991 [KR] Rep. of Korea ............... 91-22055

[51] Int. Cl.$^5$ ..................................... H01L 21/265
[52] U.S. Cl. ................................. 437/40; 437/71; 437/239; 437/913; 148/DIG. 1; 148/DIG. 117; 148/DIG. 150
[58] Field of Search ................ 437/40, 71, 101, 911, 437/913, 239, 40; 148/DIG. 117, DIG. 118, DIG. 150, DIG. 1

[56] References Cited

U.S. PATENT DOCUMENTS

| 4,624,737 | 11/1986 | Shinbo ............... 156/656 |
| 4,885,258 | 12/1989 | Ishihara et al. ....... 437/101 |
| 5,010,027 | 4/1991 | Possin et al. ......... 437/101 |
| 5,053,354 | 10/1991 | Tanaka et al. ......... 437/40 |
| 5,075,237 | 12/1991 | Wu ................... 437/40 |
| 5,084,399 | 1/1992 | Tei ................... 437/71 |
| 5,202,274 | 4/1993 | Bae et al. ............ 437/40 |

FOREIGN PATENT DOCUMENTS

| 58-07874 | 1/1983 | Japan . |
| 58-127345 | 7/1983 | Japan ................. 437/71 |
| 59-14673 | 1/1984 | Japan . |
| 0149272 | 2/1989 | Japan ................ 437/911 |

OTHER PUBLICATIONS

Cook; "Anodizing Silicon is economical to isolate IC elements", pp. 109–113, Electronics, 1975.
Vuillermoz et al., "High Frequency Anodization of Silicon"; Insulating Films on Semi., pp. 234–237, 1983.

Primary Examiner—Tom Thomas
Assistant Examiner—Michael Trinh
Attorney, Agent, or Firm—Robert A. Westerlund; Stephen R. Whitt; Charles R. Donohoe

[57] ABSTRACT

A method for manufacturing a semiconductor device which utilizes anodic oxidation. A first semiconductor layer of a first conductive type is formed on an insulating substrate, a highly doped second semiconductor layer of the first conductive type is formed on the first semiconductor layer, and then an anti-oxidizing pattern is formed on the second semiconductor layer to expose a predetermined portion of the second semiconductor layer. After forming the anti-oxidizing pattern, anodic oxidation is performed to oxidize the exposed portion of the second semiconductor layer. Instead of employing a conventional plasma etching process for removing the portion of the ohmic contact layer which is not in contact with the source and drain electrodes, the portion of the ohmic contact layer to be removed is subjected to anodic oxidation, to thereby form an anodic oxidation layer, thus facilitating removal of the unnecessary portions of the ohmic contact layer without the use of a plasma etching step. Accordingly, the problems resulting from the use of a plasma etching process can be avoided, so that a TFT having a high reliability can be obtained.

8 Claims, 7 Drawing Sheets

METHOD FOR MANUFACTURING A THIN FILM TRANSISTOR

BACKGROUND OF THE INVENTION

The present invention is related to a method for manufacturing a semiconductor device, and more particularly to a method for manufacturing a thin-film transistor (TFT) used as a switching device of a liquid crystal device (LCD).

In response to a rapidly increasing demand for space-saving, personalized displays which serve as the primary information transmission interface between human beings and computers (and other types of computerized devices), various types of flat screen or flat panel displays have been developed to replace conventional display devices, particularly CRTs, which are relatively large, bulky and obtrusive. Among the most attractive of these flat panel displays are LCDs, which, in some forms, match or surpass the color picture quality of CRTs. In particular, an active matrix LCD utilizes a combination of liquid crystal technology and semiconductor technology, and is generally recognized as being superior to CRT displays.

The active matrix LCDs utilize an active device having a non-linear characteristic for driving each of a multiplicity of pixels arranged in a matrix configuration, to thereby provide both a memory function and an electronic optical effect of a liquid crystal. A thin film transistor (TFT) is ordinarily used as an active device. In an active matrix LCD which utilizes such active devices, tens of thousands to millions of active devices are integrated on a glass substrate together with a pixel address wiring pattern, to thereby provide an active matrix driver circuit, with the TFTs serving as switching devices.

Figure 1:
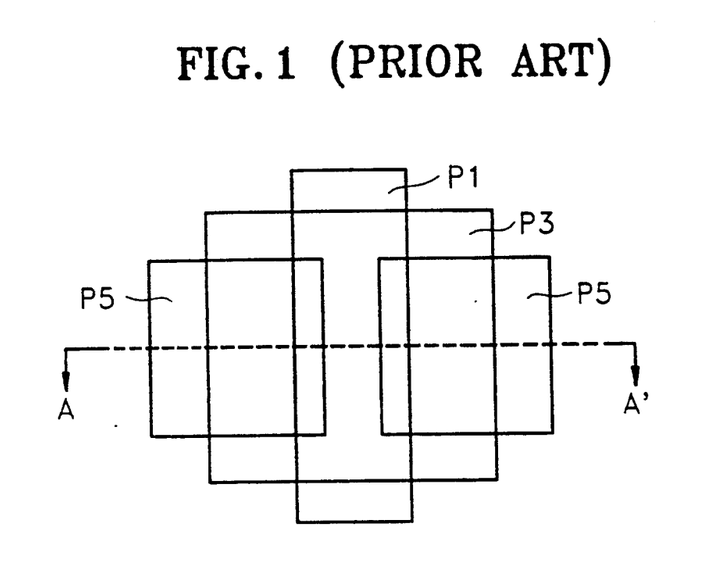
FIG. 1 is a schematic layout of a conventional TFT.

FIG. 1 is a schematic layout of a conventional TFT. Referring to FIG. 1, reference number P1 denotes a mask pattern for forming a gate electrode pattern of a transistor, P3 denotes a mask pattern for forming a semiconductor layer pattern used as a channel portion of a transistor, and P5 denotes a mask pattern for symmetrically forming a source/drain pattern centering the gate electrode pattern.

Figure 2:
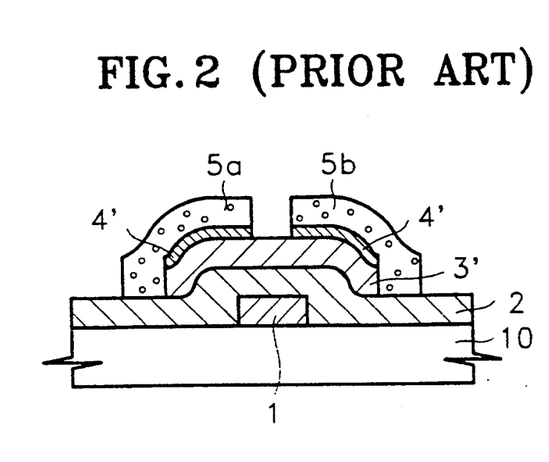
FIG. 2 is a sectional view taken along A-A' line in FIG. 1.

FIG. 2 is a sectional view taken along A-A' line in FIG. 1. A TFT is manufactured as follows, by employing the aforementioned mask patterns. A metal layer for a gate electrode is deposited on glass substrate 10, and the deposited metal layer is patterned by employing mask pattern P1 of FIG. 1 to form a gate electrode 1. Then, a gate insulating layer 2 is formed on the whole surface of the glass substrate on which the gate electrode 1 is formed, and a first material layer for forming a semiconductor layer and a second material layer which is formed by highly doping impurities into the upper portion of the first material layer are formed thereon sequentially. Then, the first and second material layers are patterned simultaneously by employing the mask pattern (P3 in FIG. 1) for forming a semiconductor layer 3' constituted by the first material layer and an ohmic contact layer 4' constituted by the second material layer. After forming the semiconductor layer 3' and the ohmic contact layer 4', a metal layer is deposited on the entire surface of the resultant structure and then patterned (employing the mask pattern P5 in FIG. 1) to form source and drain electrodes 5a and 5b. By removing the portion of the ohmic contact layer which is not in contact with the source and drain electrodes, by means of an etching process, a TFT is completed as shown in FIG. 2.

In a conventional method for manufacturing such a TFT, a dry etching process (generally, a plasma etching process) is typically used in etching the portion of the ohmic contact layer which is not in contact with the source and drain electrodes. Typically, this plasma etching process is implemented as follows. First, a plurality of wafers to be etched are put into a reactor, and then the reactor is evacuated. Thereafter, the reactor is filled with a reacting gas (for use as an etching gas), for instance, carbon tetrafluoride $CF_4$ or sulfur hexafluoride $SF_6$. A small quantity of oxygen is added when filling the reacting gas. Etching is started by applying RF energy to the reacting gas mixture, which produces a highly reactive fluorine compound.

When the etching process is performed by employing such a plasma etching technique, the etching rate is faster at the edge of a wafer than at its center, due to the distance between the wafers. Therefore, conventionally, when plasma etching is carried out in etching away the portion of the ohmic contact layer which is not in contact with the source and drain electrodes, it is difficult to control the etching conditions due to the differences of the etching rate. Consequently, as an LCD employing such TFTs as switching devices becomes larger, the substrate becomes commensurately larger, thereby resulting in increased incidences of TFT defects due to the disparity of the etching rate at the center and edge portions thereof.

Also, when a photo-sensitive film is employed as an etching mask used in the etching process, the photo-sensitive film is hardened during the plasma etching process, thereby rendering it difficult to remove by chemical methods. Therefore, in most plasma systems, the gas mixture is changed from carbon tetrafluoride $CF_4$ (or sulfur hexafluoride $SF_6$) to pure oxygen, in order to remove the photo-sensitive film after the etching step is completed. Then, the photo sensitive film is oxidized to form carbon dioxide gas and vapor, and removed. This technique adversely affects the device characteristics. Additionally, the etching process becomes unduly complicated since the reacting gas mixture must be changed to oxygen in order to remove the photo-sensitive film.

Further, when etching away the portion of the ohmic contact layer which is not in contact with the source and drain electrodes, the semiconductor layer underlying the ohmic contact layer may be exposed to the plasma etchant, thereby degrading the semiconductor layer. Moreover, if undercutting or excessive etching occurs, the insulation characteristic between the gate electrode and source and drain electrodes deteriorates, and an electrical short can occur therebetween.

SUMMARY OF THE INVENTION

Therefore, in order to solve the above-mentioned problems, the object of the present invention is to provide a method for manufacturing a TFT wherein the unnecessary portion of the ohmic contact layer is removed without etching.

Another object of the present invention is to provide a manufacturing method for a TFT in which an unnecessary portion of the ohmic contact layer can be removed without adversely affecting the underlying semiconductor layer.

Another object of the present invention is to provide a method for manufacturing a TFT which is highly reliable.

To achieve the foregoing object of the present invention, it has been discovered that a highly doped semiconductor layer used as an ohmic contact layer can be easily anodic-oxidized to form an oxide layer. Accordingly, the method of the present invention is characterized in that a portion of a highly doped semiconductor layer is removed by anodic oxidation using an anti-oxidizing pattern which selectively exposes a predetermined portion of the highly doped semiconductor layer.

Briefly, according to the present invention, there is provided a method for manufacturing a semiconductor device comprising the steps of:
  forming a first semiconductor layer of a first conductive type on an insulating substrate;
  forming a highly-doped second semiconductor layer of the first conductive type on the first semiconductor layer;
  forming an anti-oxidizing pattern on the second semiconductor layer to expose a predetermined portion of the second semiconductor layer which is to be removed; and
  performing anodic oxidation after forming the anti-oxidizing pattern to oxidize the exposed portion of the second semiconductor layer.

According to the method of the present invention, an anodic oxidation process is performed on the portion of the ohmic contact layer to be removed to thereby form an anodic oxidation layer, thus facilitating removal of the unnecessary portion of the ohmic contact layer. Accordingly, the problems resulting from the conventional etching process, for example, inconsistency of the etching rate, contamination due to exposure of the semiconductor layer during the etching process, undercutting during the etching process, overetching, problems caused by removal of the photosensitive film, etc., can be eliminated.

BRIEF DESCRIPTION OF THE DRAWINGS

Further features and advantages will become more apparent from the following detailed description of preferred embodiments of the invention as illustrated in the accompanying drawings in which the same reference characters generally refer to like parts throughout the views, and in which.

DESCRIPTION OF PREFERRED EMBODIMENTS OF THE INVENTION

Embodiment 1

FIGS. 3 to 7 depict successive steps of a method for manufacturing a TFT in accordance with a first embodiment of the present invention.

Figure 3:
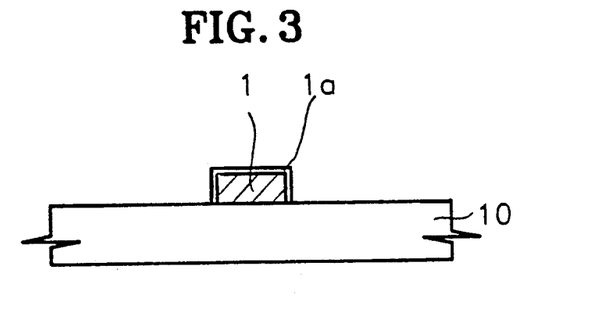
FIGS. 3 to 7 depicts successive steps of a method for manufacturing a TFT in accordance with a first embodiment of the present invention.

FIG. 3 shows the step for forming a gate electrode 1, wherein a metal, such as Ta, is deposited to a thickness of 3,000 Å to form a metal layer on an insulating substrate, for instance, a glass substrate 10, and the deposited metal layer is patterned with a mask pattern, to form gate electrode 1. Instead of Ta, other metals such as Al, Cr etc. can be used. Next, a gate insulating layer 1a formed of a metal oxide is preferably formed by partially anodic-oxidizing the surface portion of the gate electrode 1.

Figure 4:
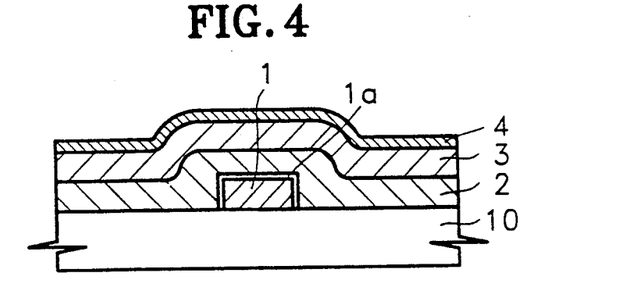

FIG. 4 shows the step for forming a gate insulating layer 2 and first and second material layers 3 and 4. After the step of FIG. 3 is completed, a gate insulating layer 2, for instance, a silicon nitride layer, is deposited to a thickness of 3,000 Å on the whole surface of the resultant structure, in a $SiH_4+NH_3+N_2$ source system, at a temperature of 350° C. A first material, (e.g., hydrogenized amorphous silicon (a-Si:H)), for forming a semiconductor layer, is deposited by a PECVD technique to a thickness of 2,000 Å, using silane($SiH_4$) as a source, to thereby form a first material layer 3 on the entire surface of the resultant structure, and then, a second material layer 4 highly doped with impurities, e.g. phosphorus (P), is formed to a thickness of 300 Å, by depositing polysilicon or microcrystalline silicon, using a $SiH_4+PH_3$ source system, on the first material layer 3. Instead of hydrogenized amorphous silicon, polycrystalline silicon (usually referred to as polysilicon) can alternatively be used as the first material.

Figure 5:
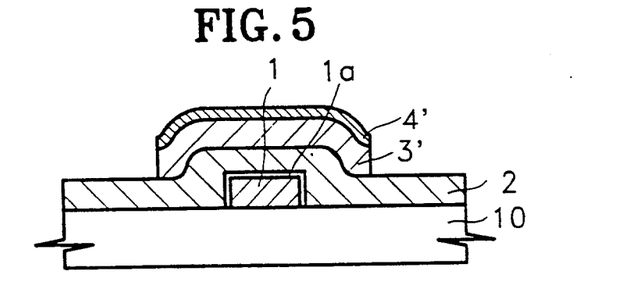

FIG. 5 shows the step for forming a semiconductor layer 3' constituted by the first material layer 3 and an ohmic contact layer 4' constituted by the second material layer 4, by employing a mask pattern for forming a semiconductor layer after the step of FIG. 4 is completed, and then successively patterning the first and second material layers 3 and 4 by wet or dry etching.

Figure 6:
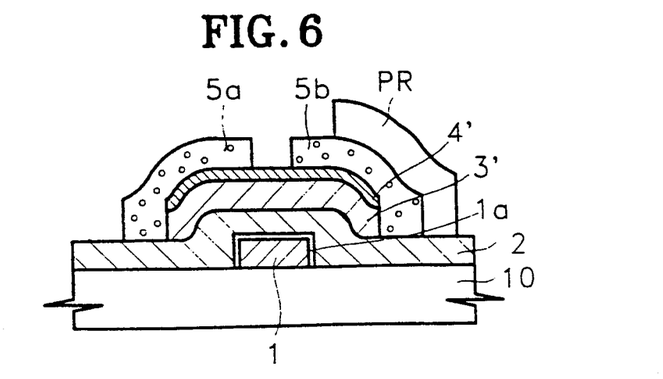

FIG. 6 shows the step for forming source and drain electrodes 5a and 5b and an anti-oxidizing pattern PR. After the step of FIG. 5 is completed, a metal capable of anodic oxidation, such as Al, is deposited to a thickness of 4,000 Å on the entire surface of the resultant structure, to thereby form a metal layer for the source and drain electrodes 5a and 5b. This metal layer is patterned by employing a mask pattern to form the source and drain electrodes 5a and 5b. Besides Al, other metals such as W, Ta, Ti, Nb etc. may be used in the present embodiment as a metal capable of anodic oxidation.

After forming the source and drain electrodes 5a and 5b, a photoresist material is coated to a thickness of 1.7 to 2.0 μm on the entire surface of the resultant structure. Then, a photolithographic process is performed to form a photoresist pattern PR. The photoresist pattern PR is preferably formed so that selected portions of the source and drain electrodes 5a and 5b are exposed. The exposed surface portions of the source and drain electrodes 5a and 5b are also preferably anodic oxidized during a subsequent anodic oxidation step. The photoresist pattern PR is used as an anti-oxidizing pattern for the source and drain electrodes 5a and 5b during the subsequent anodic oxidation step (shown in FIG. 7) employed in the present invention to selectively anodic-oxidize the portion of the ohmic contact layer 4' which is not in contact with the source and drain electrodes 5a and 5b. The photoresist material can be substituted with any material, such as nitrides, oxides etc., which can protect the ohmic contact layer 4' from oxidation during the anodic oxidation step.

When a pixel electrode is formed before forming source and drain electrodes 5a and 5b, the anodic oxidation may be performed without forming the photoresist pattern PR. Since a portion of the ohmic contact layer 4' which is to be removed is selectively exposed by the source and drain electrodes 5a and 5b, the ohmic contact layer 4' is selectively anodic-oxidized. The exposed surface portion of the source and drain electrodes 5a and 5b is anodic-oxidized in a subsequent anodic oxidation step. However, the source and drain electrodes 5a and 5b prevent the portion of the ohmic contact layer 4' other than the portion to be removed, from being anodic-oxidized. That is, the source and drain electrodes 5a and 5b serve as an anti-oxidizing pattern for the ohmic contact layer 4'.

Figure 7:
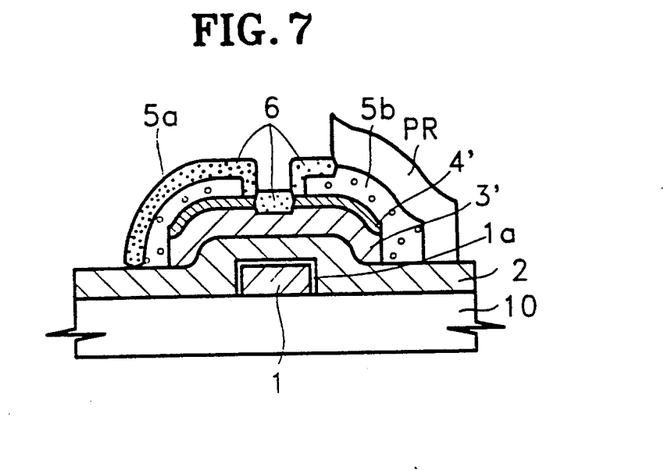

FIG. 7 shows the step of anodic oxidation. After the step of FIG. 6 is completed, anodic-oxidation is performed employing the photoresist pattern PR as an anti-oxidizing layer, to thereby oxidize the portion of the ohmic contact layer 4' which is not in contact with the source and drain electrodes 5a and 5b. As a result, an anodic oxidation layer 6 is formed on the portion of the ohmic contact layer 4' which is not covered by the photoresist pattern, i.e., the ohmic contact layer portion which is desired to be removed. That is, the portion of the ohmic contact layer 4' which is not in contact with the source and drain electrodes 5a and 5b is removed and the anodic oxidation layer 6 is formed in place of the removed portion of the ohmic contact layer 4'. The anodic oxidation may be performed in such a manner that by controlling the size of the anti-oxidizing pattern PR or the degree of the anodic oxidation, only the portion of the ohmic contact layer desired to be removed, and/or the upper portion of the semiconductor layer 3' underlying the portion of the ohmic contact layer 4' to be removed, and/or an exposed surface portion of the source and drain electrodes 5a and 5b together with the portion of the ohmic contact layer to be removed are anodic-oxidized. In this embodiment, the upper portion of the semiconductor layer 3' and the exposed surface portion of the source and drain electrodes 5a and 5b together with the portion of the ohmic contact layer 4' to be removed are anodic-oxidized, as shown in FIG. 7.

Anodic oxidation methods are widely known to those skilled in the pertinent art. For example, in U.S. Pat. No. 4,502,204, there is disclosed a method for forming a gate insulating layer wherein a semiconductor layer is oxidized into a gate oxide layer by anodic oxidation. A suitable electrolyte for use in this method is a solution of potassium nitrate and hydrogen oxide in a solvent comprising N-metylacetamide, tetrahydrofurfryl alcohol or ethylene glycol.

Figure 8:
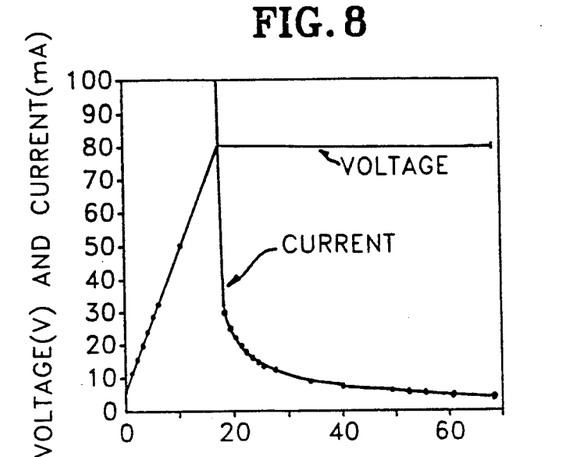
FIG. 8 is a graph depicting voltage and current change versus time during the anodic oxidation step of the method depicted in FIGS. 3-7.

FIG. 8 shows voltage and current change versus time during the anodic oxidation step. In this example, the above anodic oxidation step was performed while limiting the voltage to not more than 80 V and the current to not more than 100 mA, respectively. At first, the current is held constant while the voltage is increased. As the anodic-oxidized layer grows, the voltage needs to be increased to maintain a constant current, because the anodic-oxidized layer exhibits high resistance. After performing anodic oxidation for twenty minutes, the voltage reaches its upper limit and the current is drastically reduced, as can be seen in FIG. 8. After one hour, the current curve is nearly flat. When the anodic oxidation process is performed for four hours at 140 V, the anodic oxidation is too great, causing the anodic-oxidized layer to peel off. Therefore, it can be appreciated that the anodic oxidation step should preferably be performed for about one to four hours and the anodic oxidation voltage held below 140 V.

Figure 9:
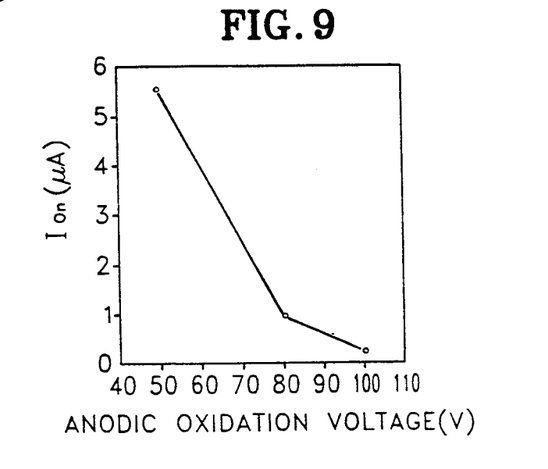
FIG. 9 is a graph depicting on-current changes versus anodic oxidation voltage.

FIG. 9 shows the on-current changes versus the anodic oxidation voltage. In this example, the anodic oxidation was performed for one hour and the gate and source/drain bias voltages were 20 V and 10 V, respectively. While a TFT obtained according to the conventional method using a dry etching step exhibits a 2 to 3 $\mu$A on-current, the TFT obtained according to this embodiment exhibits 5.6 $\mu$A on-current at an anodic oxidation voltage of 50 V. Therefore, it can be appreciated that the TFT according to the present invention is superior to the conventional one. This might be attributable to the fact that when the process includes an anodic oxidation step, no ionic damage is incurred during the etching step which otherwise results in degradation of the device characteristics. Thus, it is preferable that anodic oxidation be performed at a low voltage, e.g., below 100 V.

Figure 10:
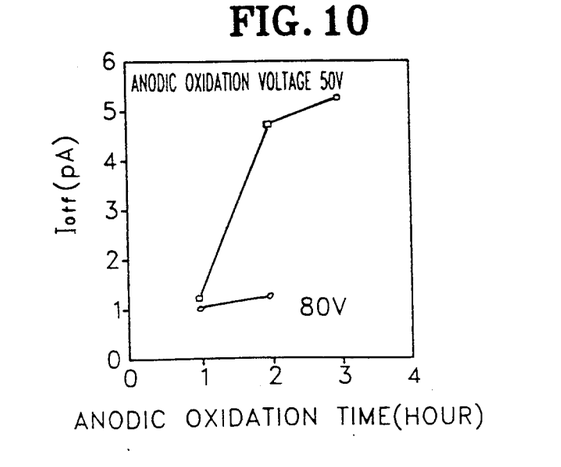
FIG. 10 is a graph depicting off-current changes versus anodic oxidation time.

FIG. 10 shows the off-current changes versus anodic oxidation time. In this example, anodic oxidation voltages were 50 V and 80 V and the gate and source/drain bias voltages were $-5$ V and $+10$ V, respectively. As the anodic oxidation time is increased, the off-current is also increased, which is undesirable. Performing anodic oxidation for one hour at an anodic oxidation voltage of 50 V produces a better TFT than that obtained according to the conventional method including a dry etching step.

Figure 11:
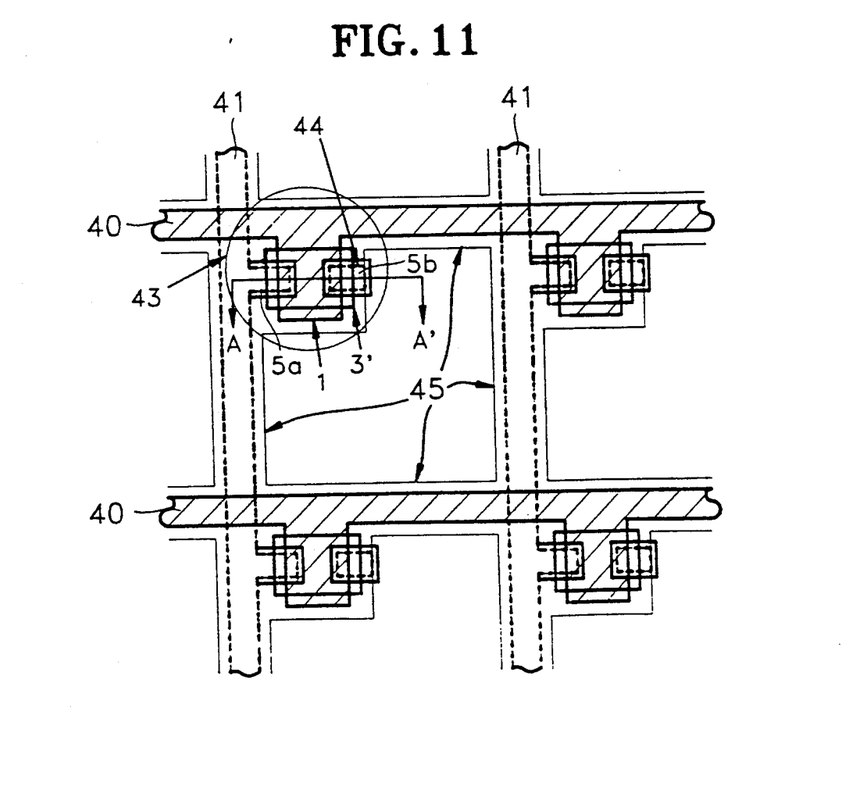
FIG. 11 is a schematic layout of one pixel of an LCD in which the TFT manufactured in accordance with the first embodiment shown in FIGS. 3 to 7 is employed.

FIG. 11 is a schematic layout of one pixel of an LCD in which the TFT manufactured in accordance with the first embodiment shown in FIGS. 3 to 7 is employed.

Referring to FIG. 11, scanning line 40 which extends in the X-direction and signal line 41 which extends in the Y-direction are arranged in a matrix form, and a TFT 43 switching device is located at each intersection of a scanning line 40 and a signal line 41. The TFT 43 comprises a gate electrode 1 connected to scanning line 40, a semiconductor layer 3' which serves as the channel portion o the TFT 43, and symmetrically configure source and drain electrodes 5a, 5b respectively. The source electrode 5a is connected to the signal line 41.

An anti-oxidizing pattern 44 is employed during the anodic oxidation step of FIG. 7. A pixel electrode portion 45 is formed in subsequent process steps. The sectional view taken along A-A' line of FIG. 11 is shown in FIG. 7.

Embodiment 2

Figure 12:
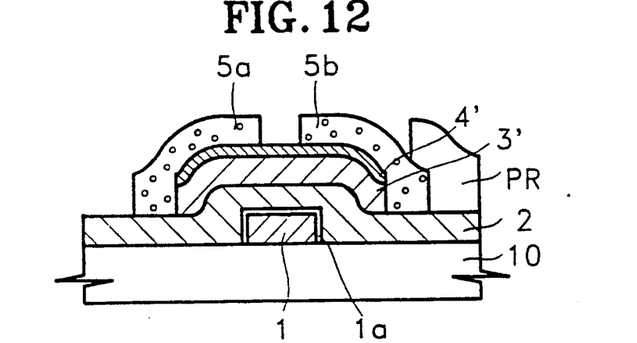
FIGS. 12 and 13 depicts successive steps of a method for manufacturing a TFT in accordance with a second embodiment of the present invention.
Figure 13:
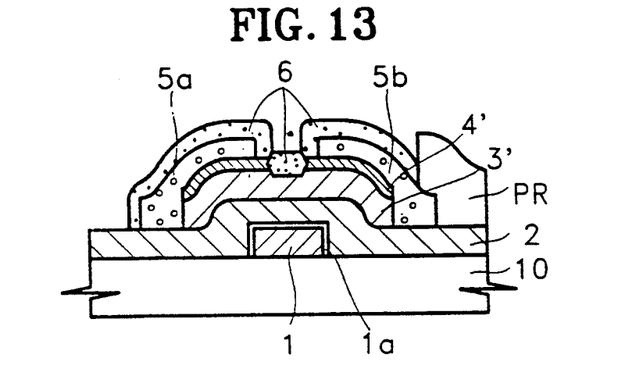

FIGS. 12 and 13 depict successive steps of a TFT manufacturing method in accordance with a second embodiment of the present invention. The steps preceding that depicted in FIG. 12 are the same as those depicted in FIGS. 3 to 5.

FIG. 12 shows the step for forming source and drain electrodes 5a and 5b, and anti-oxidizing pattern PR. After the step of FIG. 5 is completed, a metal capable of anodic oxidation such as Al, is deposited on the entire surface of the resultant structure, to thereby form a metal layer for the source and drain electrodes 5a and 5b. A mask is applied to the metal layer and patterned to form source and drain electrodes 5a and 5b in the same manner as in Embodiment 1. After forming the source and drain electrodes 5a and 5b, a photoresist material is coated on the entire surface of the resultant structure, and a photolithographic process is performed to form a photoresist pattern PR which is used as an anti-oxidizing pattern in the same manner as in Embodiment 1. The photoresist pattern PR is coincident with that of a pixel electrode portion (not shown) which will be formed in subsequent process steps.

FIG. 13 shows the step of anodic oxidation. After the step of FIG. 9 is completed, anodic oxidation is performed in the same manner as in Embodiment 1 for an hour, at 50 V anodic oxidation voltage, by employing the photoresist pattern PR as an anti-oxidizing layer, to remove the portion of the ohmic contact layer (constituted by the second material layer) which is not in contact with the source and drain electrodes 5a and 5b. Anodic oxidation layer 6 is formed on the portion of the ohmic contact layer 4' which is not covered by the photoresist pattern PR, namely, the ohmic contact layer portion desired to be removed and the exposed surface portions of the source and drain electrodes 5a and 5b. That is, the portion of the ohmic contact layer 4' which is not in contact with the source and drain electrodes 5a and 5b is oxidized to thereby form the anodic oxidation layer 6. By properly controlling the anti-oxidizing conditions, the anodic oxidation step may be performed so that the upper portion of the semiconductor layer 3' underlying the ohmic contact layer 4' is oxidized as in Embodiment 1. In this embodiment, the portion of the ohmic contact layer 4' to be removed and the upper portion of the semiconductor layer 3' are anodic oxidized as shown in FIG. 13.

Figure 14:
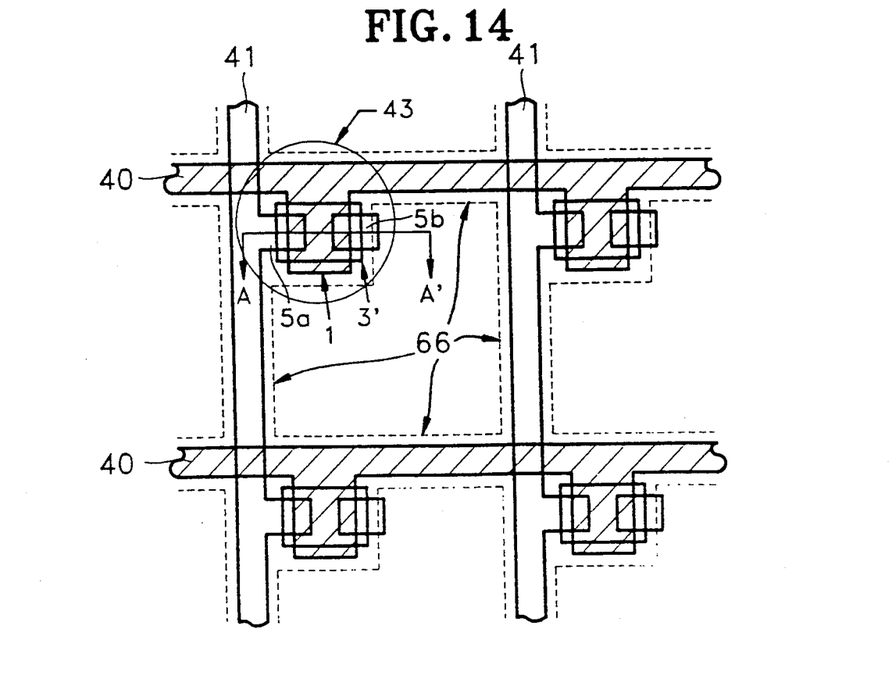
FIG. 14 is a schematic layout of one pixel of an LCD in which the TFT manufactured in accordance with the second embodiment shown in FIGS. 12 to 13 is employed.

FIG. 14 is a schematic layout of one pixel of an LCD in which the TFT manufactured in accordance with the second embodiment shown in FIGS. 12 and 13 is employed.

With reference to FIG. 14, scanning line 40 which extends in the X-direction and signal line 41 which extends in the Y-direction are arranged in a matrix form, and a TFT 43 (switching device) is located at each intersection of scanning line 40 and signal line 1. The TFT 43 comprises a gate electrode 1 connected to scanning line 40, a semiconductor layer 3' which serves as the channel portion of the TFT 43, and symmetrically disposed source and drain electrodes 5a, 5b, respectively. The source electrode 5a is connected to the signal line 41. An anti-oxidizing pattern 66 employed during the anodic oxidation process of FIG. 13, is coincident with a pixel electrode portion (not shown) formed in subsequent process steps.

In this embodiment, when the pixel electrode is formed before forming the source and drain electrodes, the anodic oxidation step may be performed without an anti-oxidizing pattern PR, as described in Embodiment 1.

Embodiment 3

Figure 15:
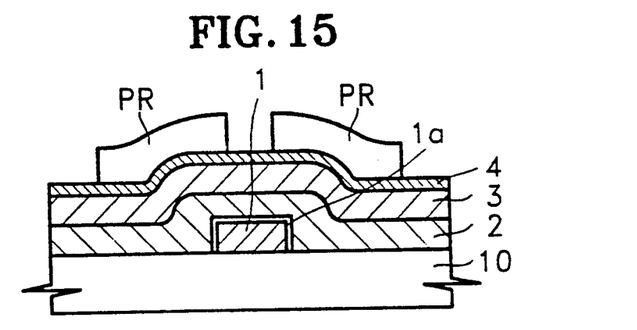
FIGS. 15 to 18 depict successive steps of a method for manufacturing a TFT in accordance with a third embodiment of the present invention; and, FIG. 19 is a schematic layout of one pixel of an LCD in which the TFT manufactured in accordance with the third embodiment shown in FIGS. 15 to 18 is employed.

FIGS. 15 to 18 depict successive steps of a TFT manufacturing method in accordance with a third embodiment of the present invention. The steps preceding that depicted in FIG. 15 are the same as those depicted in FIGS. 3 and 4.

FIG. 15 shows the step of forming anti-oxidizing pattern PR. After forming the second material layer 4 as shown in FIG. 4, a photoresist material is coated on the entire surface of the resultant structure, and a photolithographic process is performed to thereby form a photoresist pattern PR which is used as an anti-oxidizing pattern. The photoresist pattern PR covers the portions of the resultant structure where the source and drain electrodes of the TFT will be formed.

Figure 16:
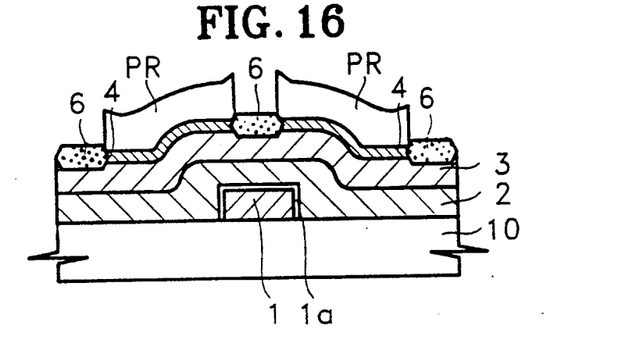

FIG. 16 shows the step of anodic oxidation. After the step of FIG. 15 is completed, anodic oxidation is performed in the same manner as in Embodiment 1 for an hour, at 50 V anodic oxidation voltage, employing photoresist pattern PR as an anti-oxidizing layer, to oxidize the portion of the ohmic contact layer 4' (constituted by the second material layer) which is not in contact with the source and drain electrodes, 5a, 5b, i.e., the portion not covered by the photoresist pattern PR. Thus, the portion of the ohmic contact layer 4' desired to be removed is oxidized to form an anodic oxidation layer 6, so that the portion of the ohmic contact layer 4' which is not in contact with the source and drain electrodes 5a, 5b, is thereby effectively removed.

Figure 17:
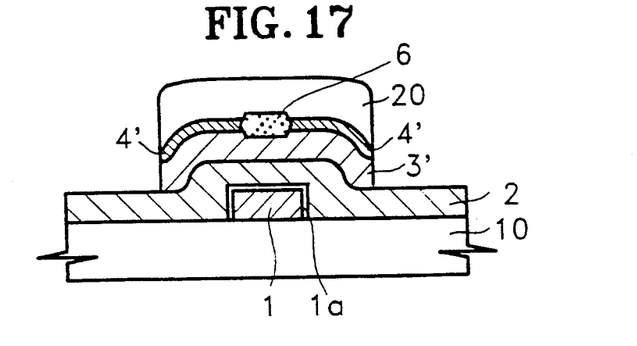

FIG. 17 shows the step of forming a semiconductor layer 3' and a ohmic contact layer 4'. After removing the photoresist pattern PR shown in FIG. 13, a masking pattern 20 for forming a semiconductor layer is formed, and the first and second material layers are patterned at the same time by employing masking pattern 20, to thereby form semiconductor layer 3' constituted by the first material layer 3 and ohmic contact layer 4' constituted by the second material layer 4.

Figure 18:
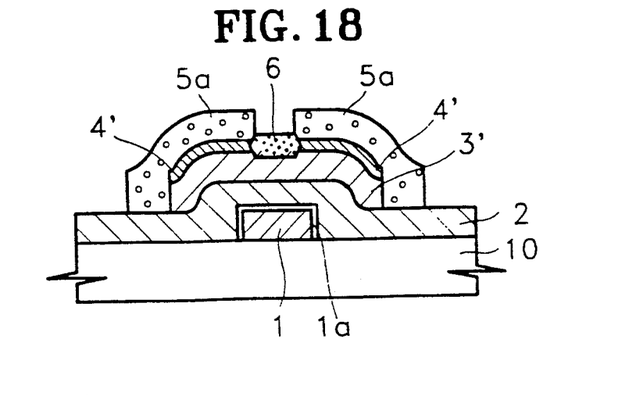

FIG. 18 shows the step of forming source and drain electrodes 5a and 5b. After the step of FIG. 17 is completed, a metal layer, such as an Al layer, is deposited on the entire surface of the resultant structure, and the metal layer is patterned in such a manner as to form source and drain electrodes 5a and 5b.

Figure 19:
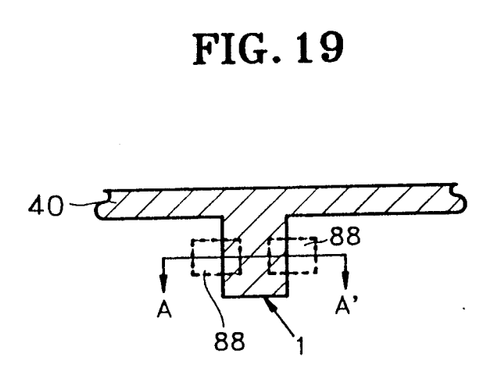

FIG. 19 is a schematic layout of one pixel of an LCD in which the TFT manufactured in accordance with the third embodiment shown in FIGS. 15 to 18 is employed.

With reference to FIG. 19, there can be seen a scanning line 40 which extends in the X-direction, a gate electrode 1 connected to the scanning line 40, and an anti-oxidizing pattern 88 employed during the anodic oxidation process of FIG. 16. FIG. 19 only depicts a schematic layout of the anti-oxidizing pattern of this embodiment for purposes of comparing the anti-oxidizing patterns used in this embodiment with those used during the anodic oxidation steps depicted in FIGS. 11 and 14. However, it should be readily appreciated that this embodiment also includes other elements such as those depicted in the layout of FIGS. 11 and 14 (for instance, a signal line, a semiconductor layer, etc.) which are not illustrated in FIG. 19. The sectional view taken along A-A' line in FIG. 19 is illustrated in FIG. 16.

In each of the above-described embodiments of the present invention, a TFT in which a gate electrode is formed under the source and drain electrode is employed. However, it should be readily appreciated that another type of TFT in which source and drain electrodes are formed on a substrate and a gate electrode is formed over the source and drain electrodes can also be employed in the practice of the present invention.

According to the method for manufacturing a TFT of the present invention, instead of the conventional plasma etching process used for removing the portion of the ohmic contact layer which is not in contact with the source and drain electrodes, the portion of the ohmic contact layer to be removed is subjected to anodic oxidation to thereby form an anodic oxidation layer, so that the unnecessary portions of the ohmic contact layer can be removed without the use of a plasma etching step. Accordingly, the problems resulting from the conventional plasma etching process, for example, inconsistency of the etching rate, contamination due to the exposure of the semiconductor layer during the etching process, undercutting during the etching process, overetching, problems occasioned by removal of the photosensitive film, etc., can all be avoided, so that a highly reliable TFT can be obtained.

Also, since the thickness of the anodic oxidation layer is determined by the voltage applied during the anodic oxidation process, the thickness can be controlled uniformly, and the anodic oxidation layer can function to protect the semiconductor layer which serves as the channel portion of the TFT, thereby protecting the semiconductor layer without the need for any additional process steps.

Additionally, when a surface portion of the source and drain electrodes as well as the portion of the ohmic contact layer desired to be removed are anodic-oxidized, electrical insulation can be increased and the anodic oxidation layer thus obtained functions to protect the metal layer which constitutes the source and drain electrodes.

Although several embodiments of the present invention have been described in detail hereinabove, it should be clearly understood that many variations and/or modifications of the basic inventive concepts herein taught which may appear to those skilled in the pertinent art will fall within the spirit and scope of the present invention, as defined in the appended claims.

What is claimed is:

1. A method for manufacturing a TFT comprising the steps of:
    forming a gate electrode on a glass substrate;
    forming a gate insulating layer to cover said gate electrode;
    sequentially forming a first material layer for forming a semiconductor layer on said gate insulating layer and a second material layer which is highly doped with an impurity;
    forming an anti-oxidizing pattern on said second material layer to expose a portion of said second material layer on said gate electrode;
    performing anodic oxidation after forming said anti-oxidizing pattern to oxidize said exposed portion of said second material layer, thereby obtaining an anodic oxidation layer;
    removing said anti-oxidizing pattern;
    forming a mask pattern to cover said anodic oxidation layer formed on said gate electrode and simultaneously patterning said first and second material layers by employing said mask pattern; and
    forming symmetrical source and drain electrodes, which center on said anodic oxidation layer formed on said gate electrode, to cover said patterned first and second material layers after removing said mask pattern.

2. A method for manufacturing a TFT as claimed in claim 1, wherein said first material layer is made of a material selected from a group consisting of hydrogenized amorphous silicon and polysilicon.

3. A manufacturing method for a TFT as claimed in claim 1, wherein said source and drain electrodes are comprised of a metal capable of anodic oxidation.

4. A method for manufacturing a TFT as claimed in claim 3, wherein said metal capable of anodic oxidation is a metal selected from a group consisting of Al, Ta, Ti, Mo, W and Nb.

5. A method for manufacturing a thin film transistor, comprising the steps of:
    forming a gate electrode on a substrate;
    forming an insulating layer on said gate electrode and adjacent surface portions of said substrate;
    forming a semiconductor layer on said insulating layer;
    forming an ohmic contact semiconductor layer on said semiconductor layer;
    forming an anti-oxidizing layer on said ohmic contact semiconductor layer;
    patterning said anti-oxidizing layer to expose a portion of said ohmic contact semiconductor layer located above said gate electrode;
    anodic oxidizing said exposed portion of said ohmic contact semiconductor layer, to thereby form an anodic oxidation layer;
    removing said patterned anti-oxidizing layer;
    patterning said semiconductor layer and said ohmic contact semiconductor layer to form a patterned structure having an upper surface and sidewalls, and including said anodic oxidation layer;
    forming a conductive layer on said upper surface and sidewalls of said patterned structure and adjacent surface portions of said insulating layer; and,
    patterning said conductive layer to form source and drain electrodes on opposite sides of said anodic oxidation layer.

6. The method as set forth in claim 5, wherein said semiconductor layer is made of a material selected from a group consisting of hydrogenized amorphous silicon and polysilicon.

7. The method as set forth in claim 6, wherein said ohmic contact semiconductor layer is made of a doped semiconductor material.

8. The method as set forth in claim 5, wherein said source and drain electrodes are positioned symmetrically on opposite sides of said anodic oxidation layer.

* * * * *